PRINTED CIRCUIT BOARD WITH AUGMENTED CONDUCTIVE HEAT-DISSIPATING AREAS

Original Filed Nov. 28, 1967

INVENTOR
LEONHARD KATZ

BY Rines and Rines

ATTORNEYS

United States Patent Office 3,531,579

Patented Sept. 29, 1970

3,531,579

PRINTED CIRCUIT BOARD WITH AUGMENTED CONDUCTIVE HEAT-DISSIPATING AREAS

Leonhard Katz, Woburn, Mass., assignor to Astro Dynamics, Inc., Burlington, Mass., a corporation of Massachusetts

Continuation of application Ser. No. 686,349, Nov. 28, 1967, which is a continuation of application Ser. No. 595,235, Nov. 17, 1966. This application Oct. 31, 1968, Ser. No. 795,371

Int. Cl. H05k *1/02, 3/02*

U.S. Cl. 174—68.5 1 Claim

ABSTRACT OF THE DISCLOSURE

Printed circuit board in which terminal-interconnecting conductors of the board are expanded in two dimensions so that a heat-dissipating conductive surface layer directly connected to the heat-generating components covers substantially ninety percent of the active side of the board. Heat-dissipation is optimized by covering the opposite side of the board with another conductive layer having apertures adjacent to the terminals of the board.

Figures 1, 2, 3:
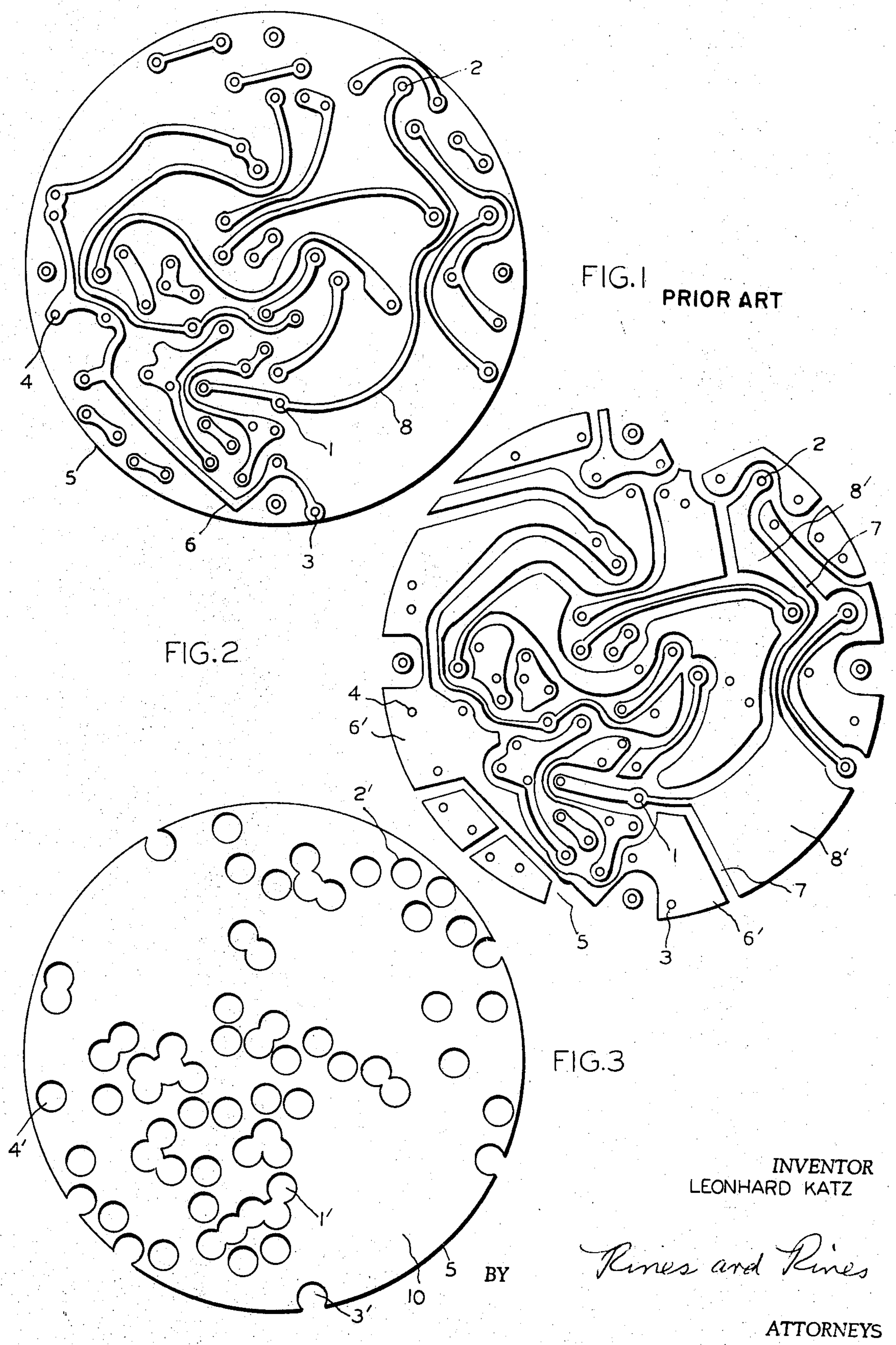
FIG. 1 PRIOR ART, FIG. 2, FIG. 3

This application is a continuation of Ser. No. 686,349, filed Nov. 28, 1967, which is itself a continuation of Ser. No. 595,235, filed Nov. 17, 1966, both now abandoned.

The present invention relates to printed circuit boards and the like and is more particularly concerned with providing such boards with vastly increased heat-dissipating capabilities.

In closely stacked printed circuit board apparatus and similar apparatus, a significant portion of the heat generated in such components or elements as resistors, condensers, diodes, transistors and the like is dissipated through the leads of these elements. The thin, substantially uniform-width lines of conductive material used on such printed circuit boards and the like to interconnect the terminals of such components or elements are thus subjected to this source of heat. Resort has accordingly been had to blowers, mounting fins and other types of devices to attempt to provide adequate heat dissipation; but, as the components are packaged in smaller and smaller units, this problem becomes more and more acute. The addition of auxiliary heat-dissipating equipment, of course, defeats the purpose of compacting the apparatus.

An object of the present invention, therefore, is to provide a new and improved printed circuit board and the like of vastly increased heat-dissipating capabilities as compared with prior art boards, and that admirably solves the problem of increasing the heat-dissipating capabilities despite the reduction in size of the apparatus.

A further object is to provide a new and improved electrically conductive heat-dissipating apparatus of more general utility, as well. In summary, the ends of the invention are achieved by transforming the narrow substantially uniform-width lines of electrical conductors connecting various pairs of terminals on the normal, conventional printed circuit board into relatively massive areas of conductive surfaces extending between the various pairs of terminals to be interconnected, and dividing or separating such areas from one another by very thin strips void of the conductive layer of the printed circuit board that thus insulate the adjacent conductive area connections. The thin strips are formed in substantially uniform width much less than the average width of said conductive areas such that the conductive areas cover preferably more than 50% of the area of the board and thereby provide radically more effective heat-dissipating connections and a vastly increased area of heat radiation and conduction.

Other and further objects will be delineated hereinafter and will be more specifically set forth in the appended claim.

The invention will now be described with reference to the accompanying drawings, FIG. 1 of which is a diagram of the conventional type printed circuit board;

FIG. 2 is a similar diagram of a board constructed in acordance with the present invention but having the same component terminals as the board of FIG. 1; and FIG. 3 is a view of the reverse side of the structure of FIG. 2.

Referring to FIG. 1, a plurality of pairs of terminals are shown, for example, at 1, 2, 3 and 4, provided upon what originally was a conductive surface layer, as of copper, deposited upon a thin sheet of insulating board 5. In accordance with conventional practice, the desired thin or narrow substantially uniform-width conductive lines intended to serve as connections between the terminals are permitted to remain on the board 5 after etching away the rest of the original conductive layer. Thus, the copper conductive narrow line 6 is shown connecting terminals 3 and 4; the conductive line 8, connecting the terminals 1 and 2; and so on. As before stated, the heat generated at the leads and terminals of the various electrical components or elements connected with terminals 1, 2, 3 and 4, etc. is extremely high and these thin electrical conductive lines 6, 8, etc. in the conventional printed circuit board, while satisfactory to conduct the current and establish electrical connection between the terminals, offer minimal heat-radiating or other dissipating functions.

In accordance with the present invention, on the other hand, as more particularly illustrated in FIG. 2, the conductive layer originally deposited upon the board 5 is not completely etched away except for the thin connecting lines; but, to the contrary, as much conductive surface area is left between the locations of the various pairs of terminals that are to be interconnected as is possible. Thus, to interconnect the same terminals 1 and 2 of FIG. 1 in accordance with the invention illustrated in FIG. 2, relatively massive and widely irregular areas of conductive layer 8' are provided, serving not only as the electrical connection between terminals 1 and 2, but, in this particular example, providing more than 500% additional surface area for dissipating heat than the narrow line connection 8 of FIG. 1. Similar remarks apply with regard to the relatively massive irregular conductive area connections 6' in FIG. 2 extending between terminals 3 and 4, enabling far greater dissipation of heat than the corresponding thin line connection 6 of FIG. 1, in addition to electrically connecting the terminals 3 and 4. Through this expedient, which is contrary to the manner in which printed circuit boards have heretofore been designed and opposite to the teachings of the art that electrical connections should be made thin or narrow and as uniform as possible, it has been found that an increase of as much as 400% in heat dissipation can be attained by the printed circuit board constructed as shown in FIG. 2 as compared with that of FIG. 1.

Further to this end, it is preferable that the insula'ion provided by those thin substantially uniform strips 7 of the board 5 separating the conductive areas and that are left void of conductive material, be as narrow as possible consistent with avoiding arcing problems. In practice, strip widths of the order of $\frac{3}{64}$ inch have been found effective, such widths being much less than the average width of the relatively large conductive areas 8'—8' and 6'—6', etc., whereby the total area occupied by the various conductive area connections covers generally much more than 50% of the area of the sheet, as compared with a typical value of about 15% conductive area provided in present-day printed circuit boards and the like. With configurations of the type shown in FIG. 2, more-over, conductive areas occupying approximately substantially 90% of the area of the board 5 can be obtained for the novel results above described.

In FIG. 3, the reverse or opposite side of the circuit board 5 of FIG. 2 is shown wherein the conductive layer 10 covers substantially the complete opposite surface except for small insulating areas, shown preferably as substantially circular regions 1', 2', 3', 4', etc. in the vicinity of their respective terminals 1, 2, 3, and 4, etc. of FIG. 2. This reverse-side large conductive surface area, also serves to enhance heat dissipation.

Further modifications will occur to those skilled in this art and all such are considered to fall within the spirit and scope of the invention as defined in the appended claim.

What is claimed is:

1. A printed circuit board comprising, in combination, an insulating sheet having a multiplicity of pairs of terminals thereon and carrying on one side thereof a conductive surface layer covering substantially 90% of said side of the sheet, said conductive surface layer being comprised substantially entirely of a multiplicity of disparate conductive areas having widely irregular widths and geometrical configurations, said conductive areas being separated from one another by relatively thin strips void of said conductive layer and serving to insulate adjacent conductive areas from one another, said thin strips being of substantially uniform width much less than the average width of said conductive areas, substantially all of stid multiplicity of conductive areas having portions directly connecting associated pairs of terminals, many of said conductive areas having other portions deviating substantially from their terminal-connecting portions and extending over regions of said side of said board remote from their terminal-connecting portions, some of said conductive areas extending to a lateral extremity of said layer, other of said conductive areas being isolated from the lateral extremities of said layer, and some of said conductive areas having irregularly curved opposite side edges which are skewed relative to each other, thereby to define a widely irregular array of heat radiators connected to said terminals and covering almost one side of said board, said insulating sheet carrying on its side opposite to said conductive surface a further conductive surface disposed over substantially the complete opposite side except for insulating areas in the vicinity of said terminals, whereby the heat-dissipating characteristcis of the board are greatly increased with respect to a printed circuit board having substantially uniform-width lines of conductive material connecting pairs of terminals.

References Cited

UNITED STATES PATENTS

| | | | |
|---|---|---|---|
| 3,042,740 | 7/1962 | Bosworth | 174—68.5 |
| 3,061,760 | 10/1962 | Ezzo | 317—100 |

OTHER REFERENCES

German printed application No. 1,076,212, Feb. 25, 1960, Cumpstey.

DARRELL L. CLAY, Primary Examiner

U.S. Cl. X.R.

29—625; 156—3; 317—100